Figure 1:
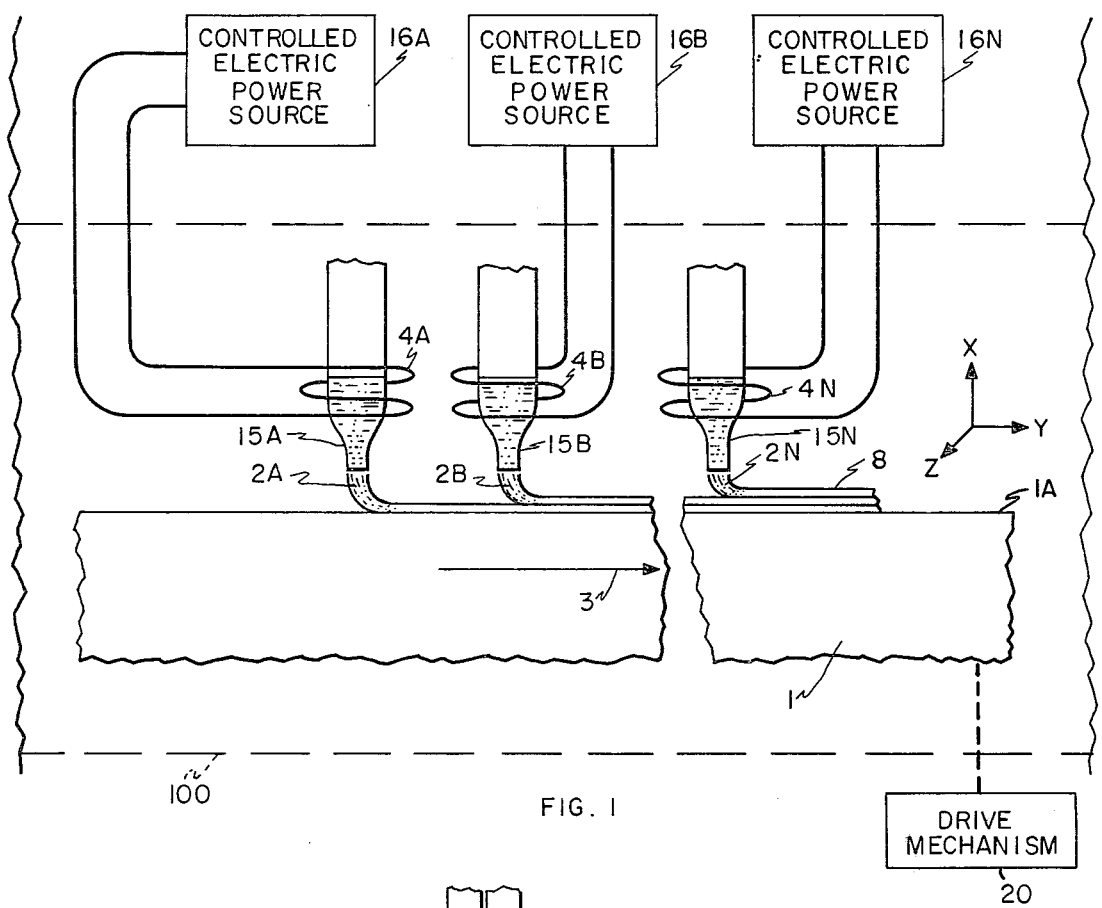

United States Patent [19]

Witt et al.

[11] 4,229,231
[45] Oct. 21, 1980

[54] METHOD OF FORMING A LAMINATED RIBBON STRUCTURE

[75] Inventors: August F. Witt, Winchester; Ramaswamy V. Raman, Boston, both of Mass.

[73] Assignee: Massachusetts Institute of Technology, Cambridge, Mass.

[21] Appl. No.: 950,965

[22] Filed: Oct. 13, 1978

[51] Int. Cl.$^2$ .......................................... H01L 21/208
[52] U.S. Cl. ....................................... 148/1.5; 148/171; 75/177; 156/624; 164/95; 427/86; 428/620
[58] Field of Search ......................... 148/171, 172, 1.5; 264/176 F, 212; 428/620, 939; 156/624, DIG. 88; 75/177; 427/86, 87; 164/96, 95; 118/412

[56] References Cited
U.S. PATENT DOCUMENTS

| | | | |
|---|---|---|---|
| 2,825,105 | 3/1958 | Pond | 428/687 X |
| 2,900,708 | 8/1959 | Pond | 428/610 X |
| 2,907,082 | 10/1959 | Pond | 264/176 F |
| 3,089,196 | 5/1963 | Knapp et al. | 264/212 X |
| 3,293,076 | 12/1966 | Allen et al. | 428/939 X |
| 3,392,126 | 7/1968 | Bindari | 75/177 X |
| 3,990,876 | 11/1976 | Heymes et al. | 264/212 X |
| 4,050,931 | 9/1977 | Tanner et al. | 75/177 X |
| 4,084,964 | 4/1978 | Grant et al. | 75/171 |
| 4,135,924 | 1/1979 | Tanner et al. | 75/177 X |
| 4,152,535 | 5/1979 | Deminet et al. | 148/1.5 X |

OTHER PUBLICATIONS

Maringer et al., "An Experimental Method for the Casting of Rapidly Quenched Filaments and Fibers", Battelle Lab., pp. 29-36.
Raman, Doctoral Thesis, Northeastern U., Boston, Mass., Dec. 1977, pp. 1-185.
Hubert et al., *Z. Metallkde.*, "Manufacture of Metallic Wires and Ribbons by the Melt Spin and Melt Drag Processes", 1973, pp. 835-842.
Pond et al., *Transactions of the Metallurgical Society of AIME*, vol. 245, Nov. 1969, pp. 2475-2476.
Gilman, *Physics Today*, May 1975, pp. 46-53.
Witt et al., "On the Formation of Laminated Semiconductor-Amorphous Metal Ribbon by Melt-Spinning Technique," pp. 1-6, unpublished.
Kavesh, A. S. M., 1976 Materials Science Seminar, "Metallic Glasses—Principles of Fabrication," Sep. 18, 1976, Niagara Falls, N.Y., pp. 1-9.

*Primary Examiner*—G. Ozaki
*Attorney, Agent, or Firm*—Arthur A. Smith, Jr.; Robert Shaw

[57] ABSTRACT

A method of forming, by melt-spinning techniques, a laminated ribbon structure consisting, for example, of a semiconductor disposed on a metal ribbon substrate. The substrate may be 10–100 μm thick and the semiconductor may be 10–100 μm thick, for example; typically the ribbon width is about one millimeter to several centimeters.

28 Claims, 4 Drawing Figures

METHOD OF FORMING A LAMINATED RIBBON STRUCTURE

The Government has rights in this invention pursuant to Grant No. 7680895-DMR and Institutional Patent Agreement No. 0010, awarded by the National Science Foundation.

The present invention relates to methods of forming ribbons using melt-spinning techniques and to the articles formed thereby.

By way of background, attention is called to U.S. Pat. Nos. 2,900,708 (Pond) and 2,907,082 (Pond); a note entitled "A Method of Producing Rapidly Solidified Filamentary Castings" (Pond et al) *Transactions AIME*, Vol. 245, Nov. 1969, pp. 2475-6, and journal articles entitled "Metallic Glasses" (Gilman), Physics Today, May 1975, pp. 46-53; a paper entitled "Metallic Glasses—principles of Fabrications" (Kavesh), A.S.M., 1976 Materials Science Seminar, Niagara Falls, N.Y., Sept. 18, 1976; and an announcement entitled "An Experimental Method for the Casting of Rapidly Quenched Filaments and Fibers," (Maringer et al), Battelle Development Corporation, Second Rapidly Quenched Metals Conference, MIT Press (1976), pages 29 et Seq., Editors N. J. Grant and B. C. Giessen.

Semiconductor ribbons, particularly silicon ribbons, hold promise of a low-cost material for photovoltaic applications. Several techniques for producing metallic ribbons are included in the above patents and writings. Ultra-high cooling rates have been achieved by using techniques in said Pond et al note. Ribbons formed using such techniques made by the present inventors were typically twenty micrometers in thickness, about one millimeter wide and several meters long. Cooling rates as high as $10^{6\circ}$ C./second were achieved (see Grant et al U.S. Pat. No. 4,084,964 on high rates of cooling in another context); but semiconductor ribbons so formed are quite brittle and break into small pieces about a few centimeters in length.

Accordingly, it is one of the principal objects of the present invention to provide a ribbon which is mechanically stable.

Another object is to provide a ribbon wherein a portion thereof is formed of a semiconductor material.

The present inventors have found that such mechanical stability can be achieved in a semiconductor ribbon and its semiconducting properties can be unaffected by forming a ribbon as a multi-layered structure wherein one or more layers are a semiconductor material (i.e., an electronically active layer) and one or more layers are formed of a ductile material at least one of which constitutes a substrate. Still another object, therefore, it to provide such a ribbon in the form of a multi-layered structure.

Another object is to provide intimate contact between the electronically active layer and the substrate in such a way that uncontrolled contamination of the interface, substrate-active layer, is minimized and that a reproducible ohmic contact or a Schottky barrier is formed.

The ribbon is formed on the surface of a drum or other device which often adversely affects the ribbon. A still further object is to eliminate any adverse effects of the moving heat sink (drum or some other device) on the structure and purity of the electronic (or other) material deposited.

These and still further objects are addressed hereinafter.

The foregoing objects are achieved by a method of forming a ribbon structure (and the ribbon structure formed thereby) by rapid solidification of a melt wherein a first melt is deposited upon a fast moving surface and simultaneously depositing upon the first melt a second melt which quickly forms a solid layer. The method described in greater detail involves depositing a first melt upon a fast moving surface where the first melt quickly cools to form a first solid layer which can be ductile; a second melt is deposited on the first solid layer, quickly cooling to form a second solid layer that can be brittle. it will be seen in the explanation hereinafter that the depositing of the first melt and the second melt occur simultaneously in time but are spatially removed from one another. It will also be shown that the cooling, particularly of the second melt, must be sufficiently fast so that the resulting solid is not contaminated by diffusion from the first solid. Additional solid layers may be formed in the manner just noted, to provide a ribbon composed of several layers.

The invention is hereinafter descried with reference to the accompanying drawing in which:

FIG. 1 is a diagrammatic side-view representation of apparatus adapted to perform the present method.

Figure 2:
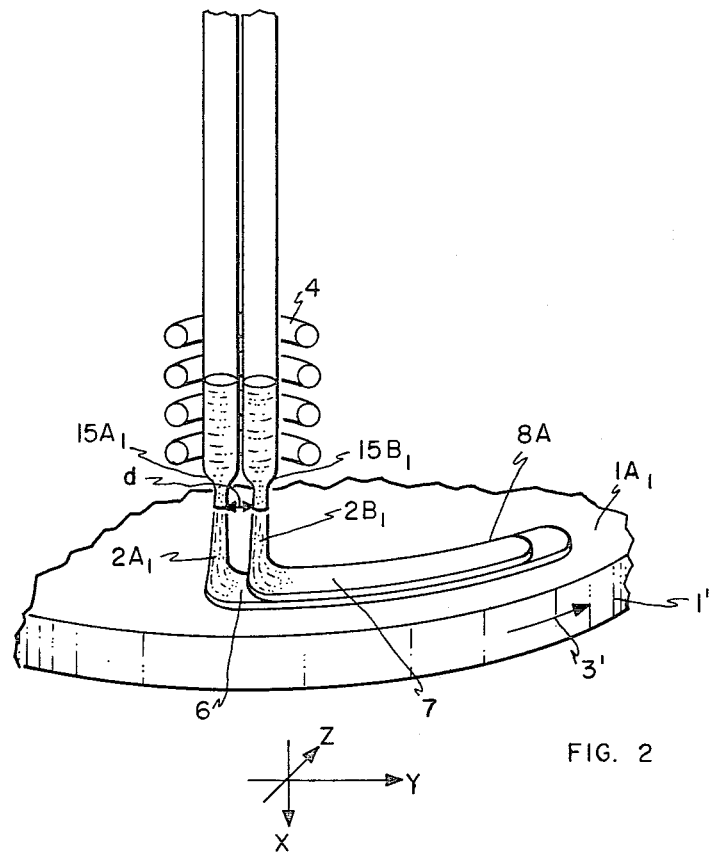
Figure 3:
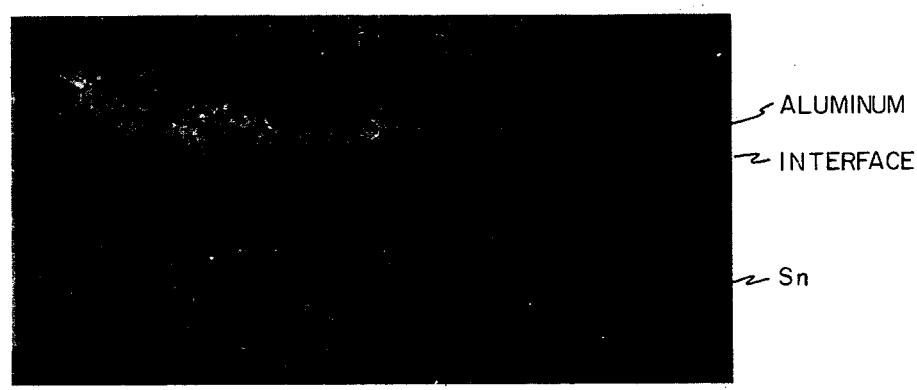
Figure 4:
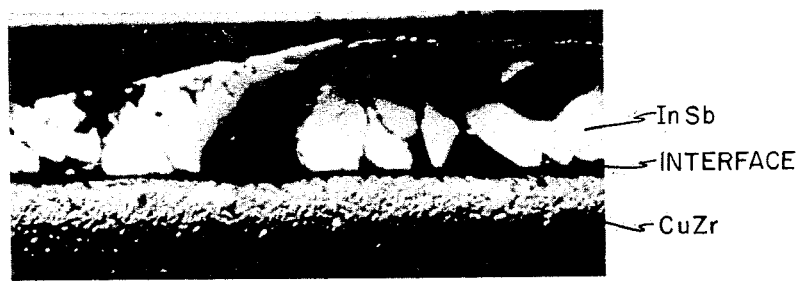

FIG. 2 is a side-view of a portion of apparatus that is a modification of the apparatus of FIG. 1; and FIGS. 3 and 4 are photomicrographs (respectively $\times 916$ and $\times 821$) showing the interfaces of two multlayered ribbons formed using the present techniques.

The apparatus used by the present inventors is a modified version of that described in the Pond et al note. Details of the experimental arrangement of Pond et al are found in the inventor Raman's doctoral thesis (Northeastern University, Boston, Massachusetts, December 1977). The teaching herein, as distinguished from Pond et al, employs a plurality of nozzles, whose output orifices are spatially separated from one anoher and whose temperatures may be indepently controlled, to deposit simultaneously a plurality of melts, spaced from one another, one melt being deposited upon the other to form, when the melts solidify, a multi-layered structure. Briefly, in preferred form, as indicated, the ultimate structure formed in accordance with the present invention is a multi-layered ribbon structure of the type shown in either FIG. 3 or FIG. 4, for example. Typically the ribbon consists of two layers, but may have more.

As shown in FIG. 1, a multi-layered solid ribbon 8 is formed on a fast-moving, heat extracting surface 1A of a drum or the like that is driven by a drive mechanism 20 to move in the direction of the arrow labeled 3 (i.e., the y-direction in FIG. 1). A first melt 2A, a second melt 2B . . . , and Nth melt 2N are simultaneously deposited on the moving surface 1A from delivery orifices, (e.g., about capillary size or larger and round or rectangular in shape) of nozzles 15A, 15A . . . 15N, respectively, closed spaced from one another in the y-direction to form thereon the multi-layered ribbon 8. The material in the nozzles 15A . . . 15N is kept in a molten state by heating coils 4A, 4B . . . 4N respectively energized by controlled electric power sources 16A, 16B . . . 16N. The x-direction in FIG. 1 (as well as in FIG. 2) is vertical; each of the melts 2A, 2B . . . flows vertically downward in the form of a coherent-liquid stream of melt to form the multi-layered ribbon 8. Ribbon formation occurs in a chamber 100 in a controlled atmosphere which may be a vacuum or an inert or reactive gas environment, depending on the requirement with respect to the ribbon formed. The temperatures of the melts, ejection rates thereof, spacing of the nozzles orifices, and the speed of the moving surface 1A can be appropriately modified to control the microstructure of the ribbon 8, its layer thicknesses, and so forth.

Turing now to FIG. 2, the moving surface labeled $1A_1$ is a flat surface of a moving solid 1' that is capable of heat extraction, moving in the direction of the arrow shown at 3'. Two nozzles $15A_1$ and $15B_2$ are heated by a coil 4 (typically, as shown in FIG. 1, the nozzles are independently heat controlled). A first melt $2A_1$ is deposited from a first delivery orifice at the lower-most end of the nozzle $15A_1$ upon the fast moving surface $1A_1$ to effect quenching and solidification thereon and form a first solid layer 6 in ribbon form. Simultaneously, a second melt $2B_1$ is deposited from a second delivery orifice at the lower-most end of the nozzle $15B_1$, which is physically separated or spaced by an adjustable small distance d from the first orifice in the direction of movement of the first solid layer 6 (i.e., in the direction of motion of the surface $1A_1$) upon the first solid layer 6 to effect quenching of the second melt $2B_1$ and form a second solid layer 7 upon the first solid layer 6 to provide a multi-layered solid structure 8A. Typically, the second melt $2B_1$ differs from the first melt $2A_1$. It is shown below that the materials of great interest at present are semiconductors which are almost always brittle in solid form and mechanically quite unstable in ribbon form. The present inventors have found that a mechanically stable ribbon structure can be formed by making the first solid layer 6 of the multi-layered solid structure 8A using, for example, CuZr as a ductile substance and then depositing the second melt over the first layer so that a mechanically stable laminated structure is achieved. It is shown in FIG. 1 that the multi-layered structure can consist of more than two solid layers, but usually a two-layered structure is formed and the remainder of this description is devoted mostly to such a structure.

The structures of greatest interest are electronic devices, consisting for example of heterojunctions (e.g., GaAs, GaAlAs) or homojunctions, (e.g., p-n(Si)), but formations of superconductors and magnetic structures are important, as well.

To place this disclosure in context, the solid substrate layer 6 may be a lower melting glassy metal, e.g., $Mg_{0.72} Zr_{0.28}$ (m.p.340° C.), $Pd_{0.78}Si_{0.22}$(m.p.897° C.) or $Cu_{0.50}Zr_{0.50}$(m.p.935° C.) and other appropriate metals, semiconductors or insulators; the brittle solid layer may be a semiconductor such a Si, Ge, InSb, GaAs or InGaSb or a superconductor such as $Nb_3Sn$, $Nb_3(Al, Si)$, $Nb_3 (Al, Ge)$ NbN, NbC, $V_3Si$ or $V_3Ga$ or a magnetic material such as $Gd_{1-x}Fe_x$, $Y_{1-x}Fe_x$, $Tb_{1-x}Fe_x$, wherein $0 < X < 1$.

It is noted above that the concepts herein disclosed are of particular interest in connection with silicon photovoltaic devices (i.e., solar cells) wherein the device consists of two layers of doped silicon of opposite conduction types. The underlying layer 6 in such a situation will be a compatible substrate to provide a stable structure, the two layers of silicon being formed on the layer 6 to form a multi-layered ribbon like the ribbon 8 in FIG. 1, i.e., a three-layered ribbon. Similar multilayered structures using GaAs can be prepared in the same way. The solid layer 6 usually (but not always) is selected to have significantly lower melting temperature than the subsequent layer (or layers) of structure 8A, so that effective heat extraction can be achieved.

In addition to the above material types, the brittle material can be an active layer such as a semiconductor and the ductile substrate a material which forms a rectifying contact with the semiconductor layer, e.g., Si-Al. The supporting ductile substrate here and in the other examples herein can have a thickness, for example, in the range from 10 to 100 micrometers and the active layer can range from 10 to 100 micrometers in thickness; the width of the ribbon, thus formed, typically ranges from one millimeter to several centimeters. Also, a two-layered structure can be made which is temperature sensitive, e.g., copper-constantan.

Emphasis above is on the use of the underlying layer 6 as a ductile substrate to hold and render mechanically stable a brittle layer 7. The layer 6 is also chosen to be compatible with the layer 7. It has been found, however, that cooling in the range of $10^3°–10^9°$ C./second is sufficiently fast so that very little migration occurs from the layer 6 to the layer 7. A most important facet of the underlying layer is that it isolates the layer 7 from the surface $1A_1$ in FIG. 2 during solidification of the second melt $2B_1$ so that the solid layer 7 is not subject to structural effects occasioned by the surface $1A_1$. The latter facet of the invention can be used to provide a single layer 7 or a multi-layered structure consisting of the layer 7 and one or more further layers, the layer 6, in this instance, being a metal which is a liquid at the temperature of the surface $1A_1$ and remains liquid. In this operation, the first deposited liquid prevents any adverse effect of the moving heat sink surface on the solidifying active layer or layers.

Further modifications of the invention herein disclosed will occur to persons skilled in the art and all such modifications are deemed to be within the spirit and scope of the invention as defined by the appended claims.

What is claimed is:

1. A method of forming a multi-layered solid structure by means of rapid quenching of separate melts, that comprises depositing a first melt in the form of a liquid stream from a first delivery orifice upon a fast moving heat extracting surface to effect quenching and solidification thereon and form a first solid layer in ribbon form; and simultaneously depositing a second melt in the form of a liquid stream from a second delivery orifice which is physically separated by a small distance from the first orifice in the direction of movement of the first solid layer upon said first solid layer to effect quenching of the second melt and form a second solid layer upon the first solid layer to provide a multi-layered solid structure.

2. A method as claimed in claim 1 wherein the material of the second melt differs from the material of the first melt both in terms of constituents of each and in melting point temperature, the material of the first melt having the lower melting point.

3. A method as claimed in claim 1 wherein said multi-layered structure comprises more than two layers and wherein the number of layers is determined by the number of separate melts delivered.

4. A method as claimed in claim 1 wherein the temperature of each melt is independently controlled, and said distance is adjustable.

5. A method as claimed in claim 1 wherein the rate of delivery of each melt is independently controlled.

6. A method as claimed in claim 1 wherein said quenching is at least in the range from about $10^3°$ to $10^9°$ C./second.

7. The method as claimed in claim 1 wherein the structure formed constitutes an electronic device, that is, heterojunction or a homojunction.

8. A method as claimed in claim 1 wherein the solid formed constitutes a superconducting structure.

9. A method as claimed in claim 1 wherein said first solid layer is a ductile substrate and wherein the second solid layer is brittle so that a mechanically stable laminated structure is achieved.

10. A method as claimed in claim 1 wherein said first solid layer is brittle and said second solid layer is ductile so that a mechanically stable laminated structure is achieved.

11. A method as claimed in claim 1 wherein one of the layers formed is a semiconductor which can be brittle.

12. A method as claimed in claim 11 wherein the semiconductor is taken from the group consisting of InSb, GaAs, InGaSb.

13. A method as claimed in claim 1 wherein one of the layers formed is a superconductor which can be brittle.

14. A method as claimed in claim 13 in which the superconductor is taken from the group consisting of $Nb_3Sn$, $Nb_3Si$, $Nb_3$ (Al, Si) $Nb_3$(Al, Ge), NbN, NbC, and $V_3Si$.

15. A method as claimed in claim 1 wherein the separation between the first melt and the second melt is established to control, in part, the microstructure of the deposited layers.

16. A method as claimed in claim 15 wherein the speed of the moving surface is controlled to determine, in part, at least one of the microstructure of the deposited layer and the thickness of each layer.

17. A method as claimed in claim 15 wherein the rate of ejection of the melts are controlled to determine, in part, at least one of the microstructure of the respective deposited layer and the thickness thereof.

18. A method of forming a ribbon structure by rapid solidification of a melt, that comprises depositing a first melt in the form of a first liquid stream upon a fast moving surface to form thereon a first layer, depositing a second melt in the form of a second liquid stream spaced from the first liquid stream upon the first layer, and extracting heat from the second melt to quickly form a solid layer formed from said second melt.

19. A method as claimed in claim 18 wherein the fast moving surface is a heat extracting surface and wherein heat is extracted from the second melt to achieve a cooling rate in the range $10^3°$ to $10_9°$ C./second.

20. A method as claimed in claim 18 wherein the first melt is a liquid metal that remains liquid at and about room temperature.

21. A method as claimed in claim 18 wherein the first melt solidifies to form a mechanically-stable narrow ribbon substrate whose thickness is in the range about 10–100 micrometers in thickness and wherein the second melt solidifies upon the solidified substrate to form said solid layer, said solid layer being an active layer.

22. A method as claimed in claim 21 wherein the material of said solid layer is a semiconducting material and wherein the interface between said solid layer and said substrate forms ohmic contact therebetween.

23. A method as claimed in claim 21 wherein the material of said solid layer is a semiconducting material and wherein the interface between said solid layer and said substrate forms a Schottky barrier.

24. A method as claimed in claim 18 wherein cooling of said second melt to form the solid layer is sufficiently fast that insignificant diffusion occurs from the first melt into the second melt.

25. A method of forming a ribbon structure, that comprises forming a first melt into a first coherent liquid stream, effecting relative motion between the first coherent liquid stream and a heat exchange surface, depositing the first liquid stream on the heat exchange surface, where it forms a first layer, simultaneously forming a second melt into a second coherent liquid stream, effecting relative motion between the second liquid stream and the first layer, and simultaneously depositing the second liquid stream on the first layer, which second liquid stream quickly solidifies to form a solid layer.

26. A method of forming a ribbon structure, that comprises forming a first melt into a first liquid stream of molten material, depositing the first stream of molten material upon a moving heat extracting surface to form a first layer on the moving heat extracting surface to move therewith, simultaneously forming a second melt into a second liquid stream of molten material, simultaneously depositing the second stream of molten material upon the moving first layer to effect quenching of the second liquid stream of molten material and form a solid layer therefrom upon said first layer to move therewith.

27. A method as claimed in claim 26 that further includes forming a third melt into a third stream of molten material, simultaneously depositing the third liquid stream of molten material upon the solid layer to effect quenching of the third liquid stream of molten material to form another solid layer thereon.

28. A method of forming a laminated multi-layered ribbon structure for use in electrical circuitry that comprises forming several melts into several liquid streams of molten materials, the several liquid streams of molten material thus formed being spaced from one another, but being closely spaced, depositing one of the several liquid streams of molten material upon a moving heat exchange surface to form a first layer thereon, and simultaneously in time depositing another of the several liquid streams of molten material upon the first layer to effect quenching thereof to form a solid layer, and depositing other and further liquid streams of molten material successively on the solid layer thus formed to be quenched and form further successive, solid layers into a laminated multi-layered ribbon structure.

* * * * *